(12) United States Patent
Cheng et al.

(10) Patent No.: US 9,847,225 B2
(45) Date of Patent: Dec. 19, 2017

(54) SEMICONDUCTOR DEVICE AND METHOD OF MANUFACTURING THE SAME

(75) Inventors: Chun-Fai Cheng, Tin Shui Wai (HK); An-Shen Chang, Jubei (TW); Hui-Min Lin, Zhubei (TW); Tsz-Mei Kwok, Hsinchu (TW); Hsien-Ching Lo, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 154 days.

(21) Appl. No.: 13/296,908

(22) Filed: Nov. 15, 2011

(65) Prior Publication Data

US 2013/0119444 A1    May 16, 2013

(51) Int. Cl.
| | |
|---|---|
| *H01L 29/772* | (2006.01) |
| *H01L 21/336* | (2006.01) |
| *H01L 21/3065* | (2006.01) |
| *H01L 21/02* | (2006.01) |
| *H01L 21/306* | (2006.01) |
| *H01L 29/66* | (2006.01) |
| *H01L 29/78* | (2006.01) |

(52) U.S. Cl.
CPC .. *H01L 21/02639* (2013.01); *H01L 21/02532* (2013.01); *H01L 21/3065* (2013.01); *H01L 21/30604* (2013.01); *H01L 21/30608* (2013.01); *H01L 29/66636* (2013.01); *H01L 29/66628* (2013.01); *H01L 29/7848* (2013.01)

(58) Field of Classification Search
CPC .......... H01L 29/66636; H01L 29/7848; H01L 29/66696; H01L 29/66727; H01L 21/30604; H01L 21/30608; H01L 21/3065; H01L 21/02639; H01L 21/02532
USPC ............. 438/163, 300; 257/18–19, E29.193, 257/E21.431, E21.433
See application file for complete search history.

(56) References Cited

U.S. PATENT DOCUMENTS

| | | | | |
|---|---|---|---|---|
| 6,214,679 | B1 * | 4/2001 | Murthy | H01L 29/41783 257/E21.165 |
| 6,812,103 | B2 * | 11/2004 | Wang et al. | 438/300 |
| 7,084,025 | B2 * | 8/2006 | Phua | H01L 21/26586 257/E21.202 |
| 7,494,858 | B2 * | 2/2009 | Bohr et al. | 438/198 |
| 7,927,989 | B2 * | 4/2011 | Zhang | H01L 21/26506 257/E21.431 |
| 7,951,657 | B2 * | 5/2011 | Cheng et al. | 438/151 |
| 8,236,659 | B2 * | 8/2012 | Tsai et al. | 438/300 |
| 8,269,255 | B2 * | 9/2012 | Shin et al. | 257/190 |
| 8,329,547 | B2 * | 12/2012 | Wu | H01L 21/30608 257/E21.219 |
| 8,344,452 | B2 * | 1/2013 | Lindert | H01L 21/28079 257/344 |
| 8,426,284 | B2 * | 4/2013 | Yeh | H01L 21/30608 257/E21.221 |
| 8,455,317 | B2 * | 6/2013 | Shin et al. | 438/269 |

(Continued)

*Primary Examiner* — Maliheh Malek
(74) *Attorney, Agent, or Firm* — Hauptman Ham, LLP

(57) ABSTRACT

An integrated circuit device and method for manufacturing the integrated circuit device are disclosed. The disclosed method comprises forming a wedge-shaped recess with an initial bottom surface in the substrate; transforming the wedge-shaped recess into an enlarged recess with a height greater than the height of the wedge-shaped recess; and epitaxially growing a strained material in the enlarged recess.

21 Claims, 10 Drawing Sheets

(56) References Cited

U.S. PATENT DOCUMENTS

| | | | |
|---|---|---|---|
| 8,524,566 B2* | 9/2013 | Flachowsky | H01L 21/84 257/204 |
| 8,673,724 B2* | 3/2014 | Park et al. | 438/300 |
| 8,728,896 B2* | 5/2014 | Kronholz | H01L 21/823412 438/14 |
| 8,809,151 B2* | 8/2014 | Flachowsky et al. | 438/286 |
| 8,835,267 B2* | 9/2014 | Lee et al. | 438/300 |
| 8,883,651 B2* | 11/2014 | Kim | H01L 21/26506 257/E21.09 |
| 8,927,374 B2* | 1/2015 | Su et al. | 438/300 |
| 9,093,298 B2* | 7/2015 | Ekbote | H01L 27/088 |
| 9,337,337 B2* | 5/2016 | Kwok | H01L 29/7848 |
| 2003/0234422 A1* | 12/2003 | Wang et al. | 257/336 |
| 2006/0138398 A1* | 6/2006 | Shimamune et al. | 257/19 |
| 2007/0249168 A1* | 10/2007 | Rotondaro et al. | 438/700 |
| 2007/0264765 A1* | 11/2007 | Lan | H01L 21/823814 438/199 |
| 2007/0267694 A1* | 11/2007 | Ko et al. | 257/344 |
| 2008/0057710 A1* | 3/2008 | Zhu et al. | 438/682 |
| 2008/0237634 A1* | 10/2008 | Dyer et al. | 257/190 |
| 2009/0101942 A1* | 4/2009 | Dyer | 257/288 |
| 2009/0280612 A1* | 11/2009 | Shimamune et al. | 438/300 |
| 2010/0099216 A1* | 4/2010 | Suzawa et al. | 438/104 |
| 2010/0219474 A1* | 9/2010 | Kronholz et al. | 257/347 |
| 2011/0003450 A1* | 1/2011 | Lee et al. | 438/285 |
| 2011/0042729 A1* | 2/2011 | Chen | H01L 21/31116 257/288 |
| 2011/0049567 A1* | 3/2011 | Peng et al. | 257/190 |
| 2011/0101305 A1* | 5/2011 | Yu | H01L 29/045 257/18 |
| 2011/0183481 A1* | 7/2011 | Dyer | 438/198 |
| 2011/0183486 A1* | 7/2011 | Chan | H01L 29/165 438/300 |
| 2011/0201164 A1* | 8/2011 | Chung et al. | 438/229 |
| 2011/0210393 A1* | 9/2011 | Chen | H01L 21/823431 257/347 |
| 2011/0220964 A1* | 9/2011 | Shin et al. | 257/183 |
| 2011/0230027 A1* | 9/2011 | Kim et al. | 438/285 |
| 2011/0263092 A1* | 10/2011 | Cheng et al. | 438/300 |
| 2011/0312145 A1* | 12/2011 | Tsai et al. | 438/300 |
| 2012/0001238 A1* | 1/2012 | Tsai et al. | 257/255 |
| 2012/0025201 A1* | 2/2012 | Wann et al. | 257/76 |
| 2012/0025283 A1* | 2/2012 | Son et al. | 257/296 |
| 2012/0056245 A1* | 3/2012 | Kang et al. | 257/192 |
| 2012/0056276 A1* | 3/2012 | Cheng | H01L 21/26586 257/408 |
| 2012/0074468 A1* | 3/2012 | Yeh et al. | 257/255 |
| 2012/0091540 A1* | 4/2012 | Cheng | H01L 21/823412 257/410 |
| 2012/0100681 A1* | 4/2012 | Fang | H01L 21/02057 438/269 |
| 2012/0108026 A1* | 5/2012 | Nieh | H01L 21/823807 438/300 |
| 2012/0164809 A1* | 6/2012 | Yoon et al. | 438/303 |
| 2012/0168880 A1* | 7/2012 | Zhang | 257/410 |
| 2012/0181625 A1* | 7/2012 | Kwok | H01L 29/165 257/408 |
| 2012/0299099 A1* | 11/2012 | Huang et al. | 257/347 |
| 2012/0319166 A1* | 12/2012 | Adam et al. | 257/192 |
| 2012/0319168 A1* | 12/2012 | Liu | H01L 21/02381 257/192 |
| 2012/0326168 A1* | 12/2012 | Adam et al. | 257/77 |
| 2013/0001660 A1* | 1/2013 | Dyer | 257/288 |
| 2013/0015443 A1* | 1/2013 | He et al. | 257/57 |
| 2013/0020612 A1* | 1/2013 | Wann et al. | 257/190 |
| 2013/0092954 A1* | 4/2013 | Yang et al. | 257/77 |
| 2013/0122675 A1* | 5/2013 | Cheng et al. | 438/285 |
| 2013/0146949 A1* | 6/2013 | Tsai | H01L 21/26506 257/288 |
| 2013/0175524 A1* | 7/2013 | Yamazaki et al. | 257/43 |
| 2013/0244389 A1* | 9/2013 | Cheng et al. | 438/285 |
| 2013/0248930 A1* | 9/2013 | Shimamune et al. | 257/192 |
| 2015/0091103 A1* | 4/2015 | Su et al. | 257/401 |
| 2015/0179796 A1* | 6/2015 | Sung | H01L 29/7848 257/288 |

* cited by examiner

SEMICONDUCTOR DEVICE AND METHOD OF MANUFACTURING THE SAME

TECHNICAL FIELD

The present disclosure relates to integrated circuit devices and methods for manufacturing integrated circuit devices.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. For example, as semiconductor devices, such as metal-oxide-semiconductor field-effect transistors (MOSFETs), are scaled down through various technology nodes, strained source/drain features (e.g., stressor regions) have been implemented using epitaxial (epi) semiconductor materials to enhance carrier mobility and improve device performance. Forming a MOSFET with stressor regions often includes using epitaxially grown silicon (Si) to form raised source and drain features for an n-type device, and epitaxially growing silicon germanium (SiGe) to form raised source and drain features for a p-type device.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
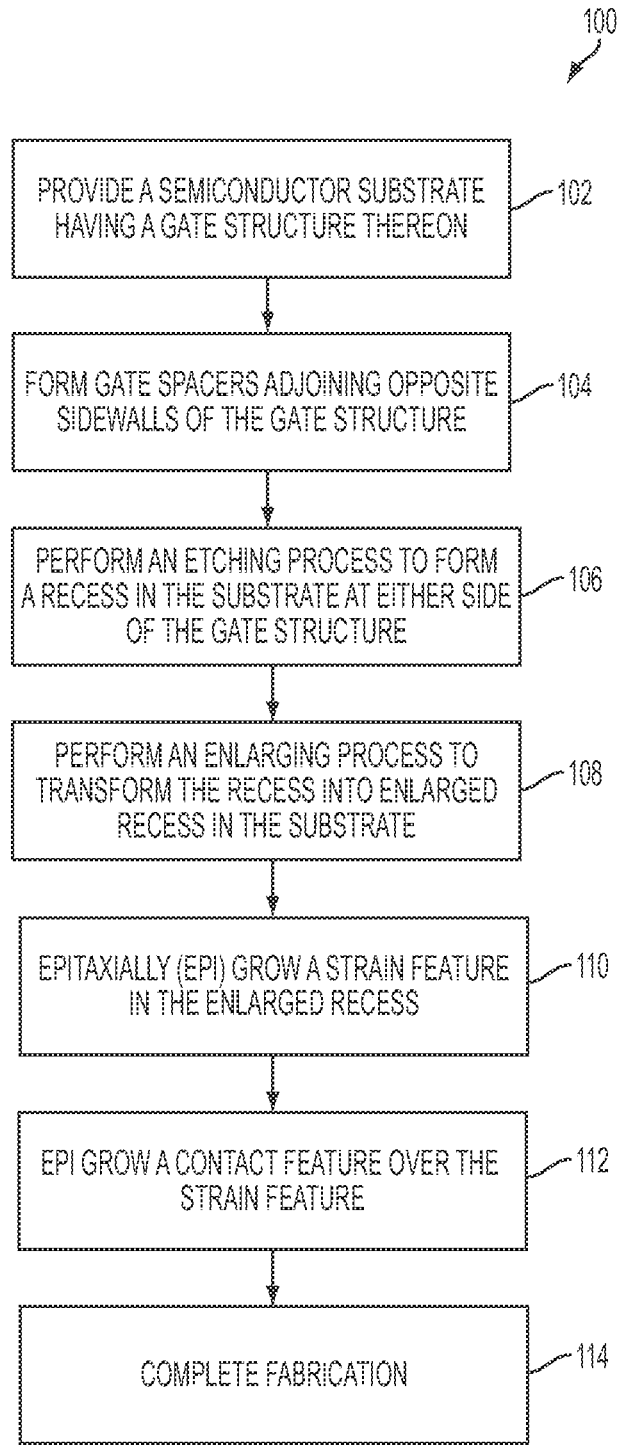
FIG. 1 is a flow chart of a method of fabricating an integrated circuit device according to an embodiment of the present disclosure.

It is understood that the following disclosure provides many different embodiments, or examples, for implementing different features of the present application. Specific examples of components and arrangements are described below to facilitate the illustrations presented in the present disclosure. These are, of course, examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 and 2-7, a method 100 and a semiconductor device 200 are collectively described below. The semiconductor device 200 depicted in FIGS. 2-7 is an integrated circuit, or a portion thereof, that can comprise memory cells and/or logic circuits. The semiconductor device 200 can include passive components such as resistors, capacitors, inductors, and/or fuses; active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof. It is understood that additional steps can be provided before, during, and/or after the method 100, and, in some embodiments, some of the steps described below can be replaced or eliminated. It is further understood that in some embodiments additional features can be added in the semiconductor device 200, and in some other embodiments some of the features described below can be replaced or eliminated.

Figure 2:
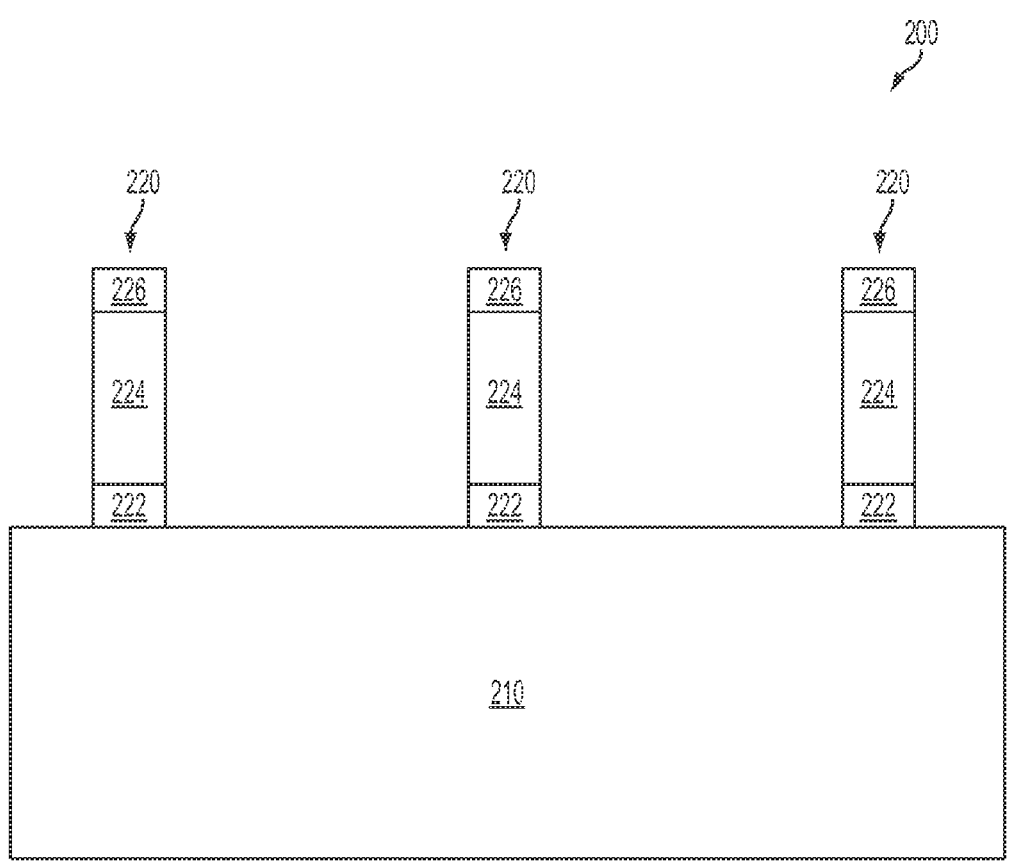
FIGS. 2, 3, 4, 4A, 5, 5A, 6A, 6B, and 7 are various diagrammatic cross-sectional views of an example integrated circuit device at various manufacturing stages according to the method of FIG. 1.

Referring to FIGS. 1 and 2, the method 100 begins at step 102, wherein a substrate 210 is provided. In the present embodiment, the substrate 210 is a semiconductor substrate comprising silicon. The silicon substrate, for example, is a so-called (001) substrate having a top surface substantially parallel with a (001) lattice plane. In some alternative embodiments, the substrate 210 comprises an elementary semiconductor including silicon and/or germanium in crystal; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure.

In some embodiments, the substrate 210 includes various doped regions depending on design requirements (e.g., p-type wells or n-type wells). The doped regions may be doped with p-type dopants, using a chemical such as boron and/or $BF_2$; n-type dopants, such as phosphorus and/or arsenic; or a combination thereof. The doped regions may be formed directly in the substrate 210, in a P-well structure, in an N-well structure, in a dual-well structure, or using a raised structure. The semiconductor device 200 may include a PFET device and/or a NFET device, and thus, the substrate 210 may include various doped regions configured for the PFET device and/or the NFET device. Gate structures 220 for the PFET device and/or the NFET device are formed over the substrate 210. The gate structures 220, for example, are formed on the substrate 210 in the <110> direction when the substrate 210 is a so-called (001) substrate. In some embodiments, each of the gate structures 220 includes, in order, a gate dielectric 222, a gate electrode 224, and a hard mask 226. In some embodiments, the gate structures 220 are formed using a deposition process, a lithography patterning process, and/or an etching process.

The gate dielectric 222 is formed over the substrate 210 and includes a dielectric material, such as silicon oxide, silicon oxynitride, silicon nitride, a high dielectric constant (high-k) dielectric material, other suitable dielectric material, or combinations thereof. Exemplary high-k dielectric materials include $HfO_2$, HfSiO, HfSiON, HfTaO, HfSiO, HfZrO, other suitable materials, or combinations thereof. In some embodiments, the gate dielectric 222 may be a multilayer structure, for example, including an interfacial layer and a high-k dielectric material layer formed on the interfacial layer. An exemplary interfacial layer may be a grown silicon oxide layer formed by a thermal process or atomic layer deposition (ALD) process.

The gate electrode 224 is formed over the gate dielectric 222. In some embodiments, the gate electrode 224 is formed by a polycrystalline silicon (polysilicon) layer. The polysilicon layer may be doped for proper conductivity. In some alternative embodiments, the polysilicon is not necessarily doped if a dummy gate is to be formed and replaced in a subsequent gate replacement process. In yet some alternative embodiments, the gate electrode 224 could include a conductive layer having a proper work function. Therefore, the gate electrode 224 can also be referred to as a work function layer. The work function layer may comprise any suitable material, such that the layer can be tuned to have a proper work function for enhanced performance of the associated device. For example, in some embodiments, a p-type work function metal (p-metal) for the PFET device comprises TiN or TaN. On the other hand, in some embodiments, an n-type work function metal (n-metal) for the NFET device comprises Ta, TiAl, TiAlN, or TaCN. The work function layer may include doped conducting oxide materials. The gate electrode 224 may include other conductive materials, such as aluminum, copper, tungsten, metal alloys, metal silicide, other suitable materials, or combinations thereof. For example, where the gate electrode 224 includes a work function layer, another conductive layer can be formed over the work function layer.

The hard mask 226 formed over the gate electrode 224 includes silicon oxide, silicon nitride, silicon oxynitride, silicon carbide, other suitable dielectric material, or combinations thereof. The hard mask 226 may have a multi-layer structure.

Figure 3:
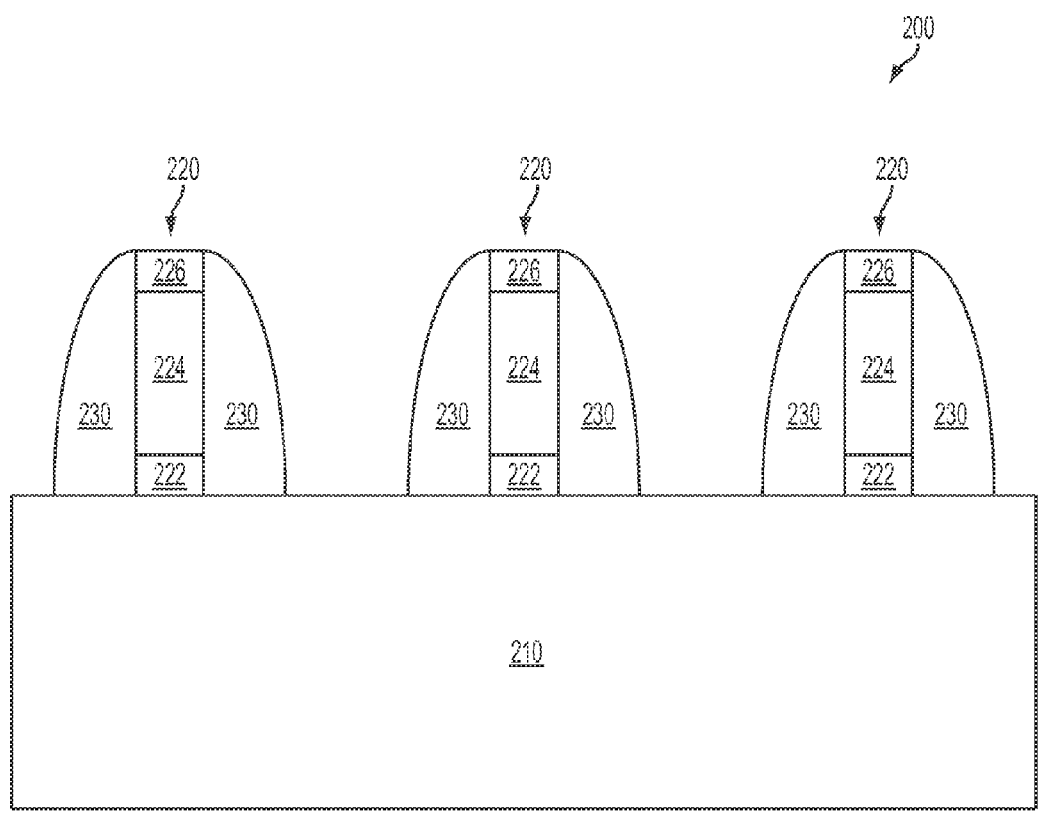

Referring to FIGS. 1 and 3, the method 100 continues with step 104 in which a pair of gate spacers 230 is formed adjoining opposite sidewalls of each of the gate structures 220. In the depicted embodiment, a first spacer material (not shown) is deposited over the gate structures 220 and the substrate 210. The first spacer material may be formed by plasma-enhanced chemical vapor deposition (PECVD) and/or other suitable processes. In at least one embodiment, the first spacer material is a dielectric layer comprising silicon oxide. In at least one embodiment, the first spacer material has a thickness of less than approximately 150 Angstroms. Thereafter, a second spacer material (not shown) is deposited over the first spacer material. The second spacer material may be deposited using physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), and/or other suitable processes. In at least one embodiment, the second spacer material is a dielectric layer comprising silicon nitride. Other exemplary compositions for the second spacer material include silicon oxide, silicon carbide, silicon oxynitride, combinations thereof, and/or other suitable materials. In at least one embodiment, the second spacer material has a thickness less than approximately 200 Angstroms.

After the formation of the first and second spacer materials over the gate structures 220, a patterning process, e.g., blanket dry etching process, is performed on the first and second spacer materials to form the gate spacers 230. The etching process may include an anisotropic etch to partially remove the first and second spacer materials from the substrate 210 in regions where epitaxy features or raised source/drain features will be formed.

Figure 4:
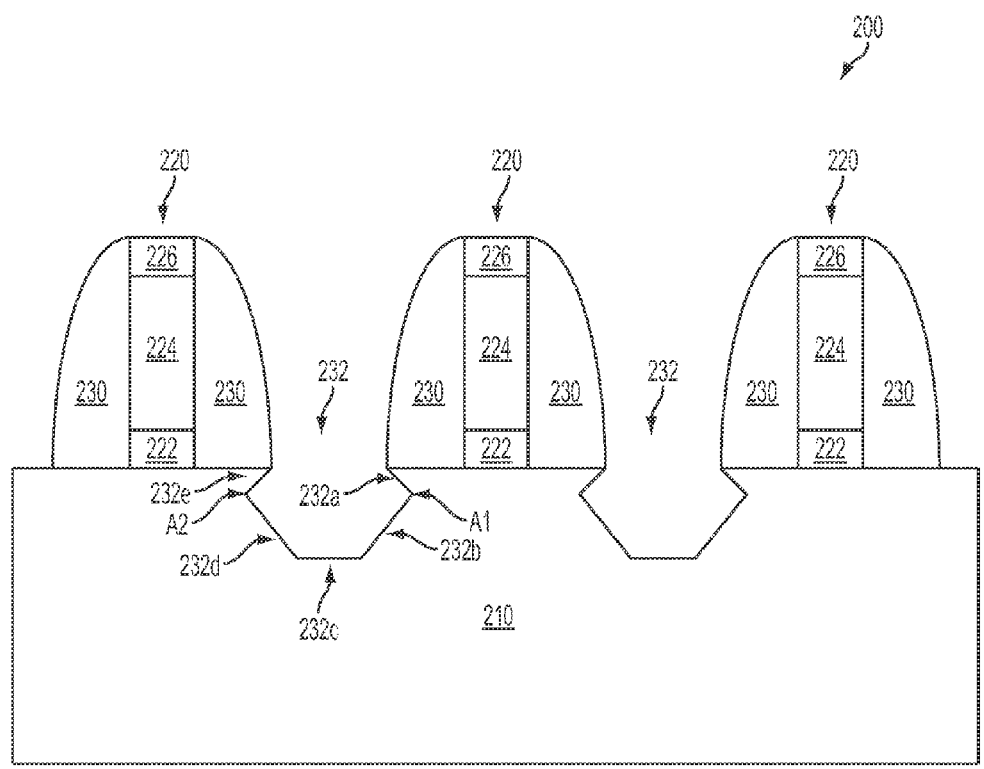

Referring to FIGS. 1 and 4, the method 100 continues with step 106 in which recess cavities 232 are formed in the substrate 210 at either side of the gate structure 220, particularly in the source and drain (S/D) regions of the PFET device or the NFET device.

A capping layer (not shown) and a photoresist layer (not shown) may be formed over the semiconductor device 200 and then patterned to protect the other device regions. The photoresist layer may further include an antireflective coating layer (not shown), such as a bottom antireflective coating (BARC) layer and/or a top antireflective coating (TARC) layer. An etching process then removes portions of the substrate 210 to form the recess cavities 232 disposed in the substrate 210 and between the gate structures 220. The etching process includes a dry etching process, wet etching process, or combination thereof. In some embodiments, the etching process utilizes a combination of dry and wet etching processes. The dry and wet etching processes have etching parameters that can be tuned, such as etchants used, etching temperature, etching solution concentration, etching pressure, source power, RF bias voltage, RF bias power, etchant flow rate, and other suitable parameters. In some embodiments, the recess cavities 232 are formed using a dry etching process first. The dry etching process is an anisotropic or isotropic etching process. For example, the dry etching process may utilize an etching pressure of about 1 mTorr to about 200 mTorr, a source power of about 200 W to about 2000 W, an RF bias voltage of about 0 V to about 100 V, and an etchant that includes $NF_3$, $Cl_2$, $SF_6$, He, Ar, $CF_4$, or combinations thereof. In an example, the dry etching process includes an etching pressure of about 1 mTorr to about 200 mTorr, a source power of about 200 W to about 2000 W, an RF bias voltage of about 0 V to about 100 V, a $NF_3$ gas flow of about 5 sccm to about 30 sccm, a $Cl_2$ gas flow of about 0 sccm to about 100 sccm, an He gas flow of about 0 sccm to about 500 sccm, and an Ar gas flow of about 0 sccm to about 500 sccm. In another example, the etching process includes an etching pressure of about 1 mTorr to about 200 mTorr, a source power of about 200 W to about 2000 W, an RF bias voltage of about 0 V to about 100 V, a $SF_6$ gas flow of about 5 sccm to about 30 sccm, a $Cl_2$ gas flow of about 0 sccm to about 100 sccm, an He gas flow of about 0 sccm to about 500 sccm, and an Ar gas flow of about 0 sccm to about 500 sccm. In yet another example, the etching process includes an etching pressure of about 1 mTorr to about 200 mTorr, a source power of about 200 W to about 2000 W, an RF bias voltage of about 0 V to about 100 V, a $CF_4$ gas flow of about 5 sccm to about 100 sccm, a $Cl_2$ gas flow of about 0 sccm to about 100 sccm, an He gas flow of about 0 sccm to about 500 sccm, and an Ar gas flow of about 0 sccm to about 500 sccm. After the dry etching process, in some embodiments, a wet etching process is subsequently applied for forming the recess cavities 232. The wet etching process is an anisotropic etching process. In some embodiments, the wet etching process using a wet etching solutions comprising $NH_4OH$, hydrofluoric acid (HF), tetramethylammonium hydroxide (TMAH), other suitable wet etching solution, or combinations thereof. In an example, the wet etching process first uses a 100:1 concentration of an HF solution at room temperature (e.g., 18-25° C.), and then uses a NH$_4$OH solution at a temperature of about 20° C. to about 60° C. In another example, the wet etching process first uses a 100:1 concentration of an HF solution at room temperature, and then implements a TMAH solution at a temperature of about 20° C. to about 60° C. After the etching process, a pre-cleaning process may be performed to clean the recess cavities 232 with a hydrofluoric acid (HF) solution or other suitable solution.

Still referring to FIG. 4, the etching profile of the recess cavities 232 is defined by facets 232a, 232b, 232c, 232d, and 232e in the substrate 210. In some embodiments, the facets 232a, 232b, 232c, 232d, and 232e together define the recess cavities 232 with wedge-shaped. The facets 232a and 232e may be referred to as upper sidewall facets, the facets 232b and 232d may be referred to as lower sidewall facets, and the facet 232c may be referred to as bottom surface facet. In the depicted embodiment, the facets 232a and 232e are formed along {111} crystallographic plane and slope to the principle surface of the substrate 210, the facets 232b and 232d are formed of {111} crystallographic plane and below the facets 232a and 232e, respectively. The facet 232c is formed of {100} crystallographic plane parallel to the principal surface of the substrate 210. In the depicted embodiment, tips A1 and A2 are defined in the etching profile of the recess cavities 232 by the intersection points of the facets 232a/232b and the facets 232d/232e, respectively. The tip A1, for example, is positioned under the gate spacer 230 toward the channel region underneath the gate structure 220. In some embodiments, the tip A1 is positioned under the gate structure 220.

Figure 4A:
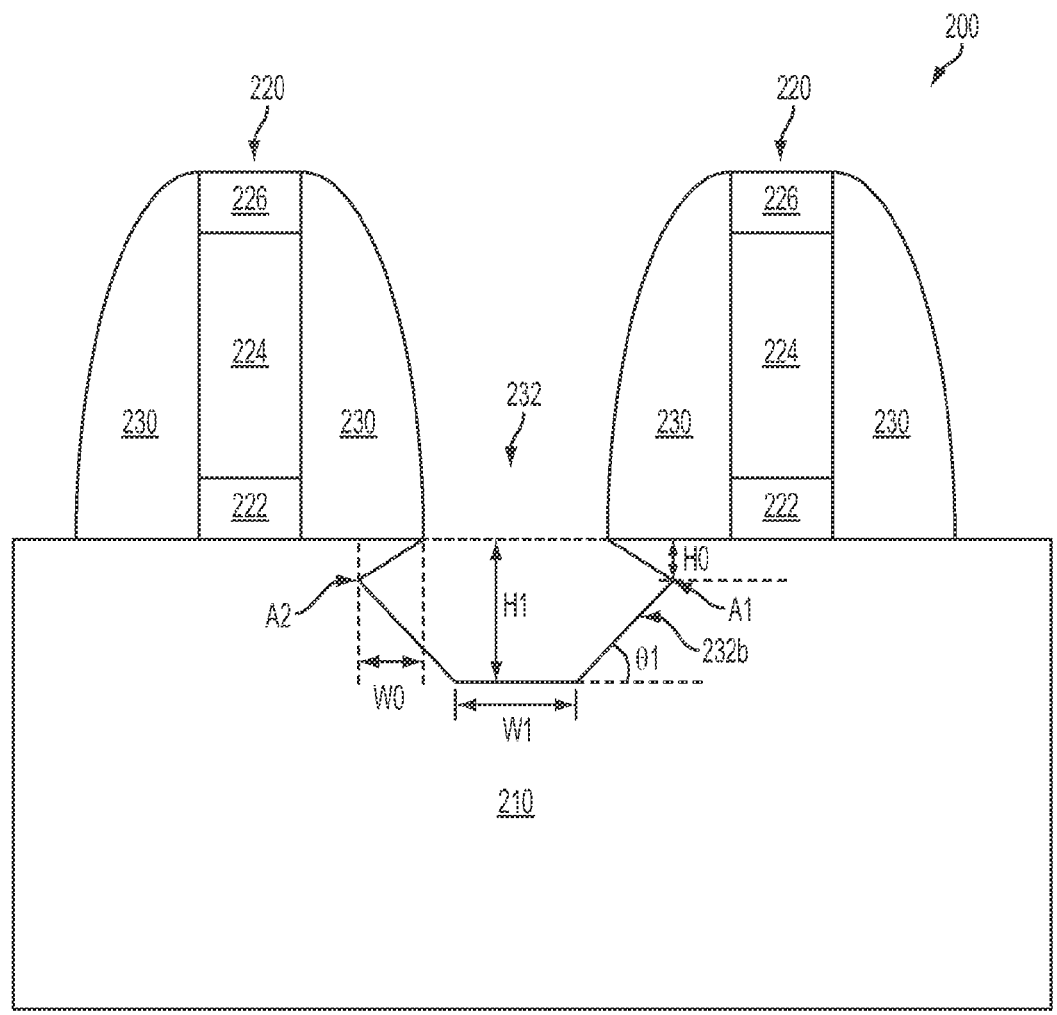

In FIG. 4A, the semiconductor device 200 illustrated in FIG. 4 is enlarged for better understanding of the profile of the recess cavity 232. An angle θ1 is measured from the facet 232b (or the facet 232d) to the principal surface of the substrate 210. In some embodiments, the angle θ1 ranges from about 40 degrees to about 70 degrees. The tip A1 (or tip A2) has a tip height H0 vertically measured from the top surface of the substrate 210 to the tip A1 (or tip A2). In the depicted embodiment, the tip height H0 ranges from about 20 Angstroms to about 150 Angstroms. The tip A2 (or tip A1) has a width W0 under the gate spacer 230 which may be referred as a surface proximity of the recess cavity 232. In the depicted embodiment, the width W0 ranges from about 20 Angstroms to about 100 Angstroms. The recess cavity 232A has a cavity height H1 measured from the top surface of substrate 210 to the bottom surface facet 232c. In some embodiments, the cavity height H1 ranges from about 200 Angstroms to about 800 Angstroms. In the depicted embodiment, the bottom surface facet 232c has a width W1 ranging from about 20 Angstroms to about 200 Angstroms. In some embodiments, a ratio of the cavity height H1 to the width W1 ranges from about 1 to about 10.

Figure 5:
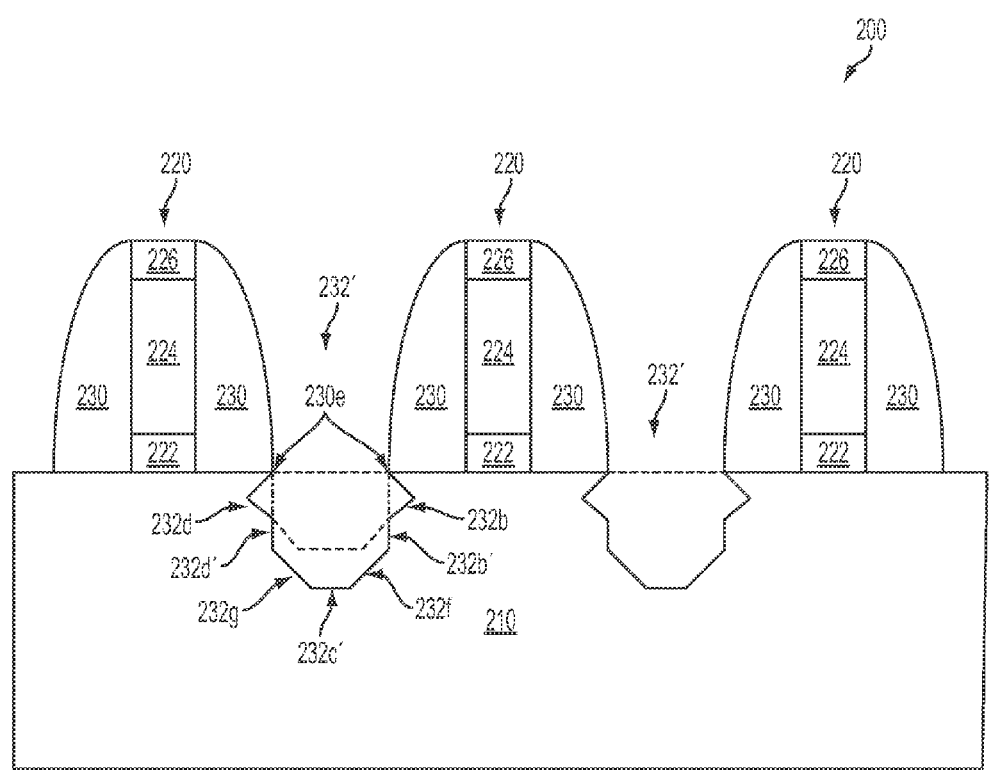

Referring to FIGS. 1 and 5, the method 100 continues with step 108 in which the recess cavities 232 are transformed into enlarged recess cavities 232' using an enlarging process. In some embodiments, the enlarging process is an etching process. In some embodiments, the enlarging process is a dry etching process. In the depicted embodiment, the enlarging process is a dry anisotropic etching process. In some embodiments, the enlarging process is an etching process using the gate spacers 230 as hard masks. For example, the etching process is performed vertically along spacer edges 230e into the substrate 210. In some embodiments, the upper sidewalls 232a, 232e and the upper portions of the lower sidewalls facets 232b, 232d are under the gate spacers 230 and not exposed to the enlarging process, therefore not transformed by the enlarging process. In some embodiments, the lower portions of the lower sidewalls facets 232b and 232d not covered by the gate spacers 230 are removed to form facets 232b'/232d' and facets 232f/232g below the facets 232b'/232d', respectively. In some embodiments, the facets 232b'/232d' are formed of {110} crystallographic plane and perpendicular to the principle surface of the substrate 210. In some embodiments, the facets 232f/232g are formed of {111} crystallographic plane, slope to the principle surface of the substrate 210, and parallel to the facets 232b/232d, respectively. The bottom surface of the enlarged recess cavity 232' is defined by a facet 232c'. In some embodiments, the facet 232c' is formed of {001} crystallographic plane and parallel to the principle surface of the substrate 210.

Figure 5A:
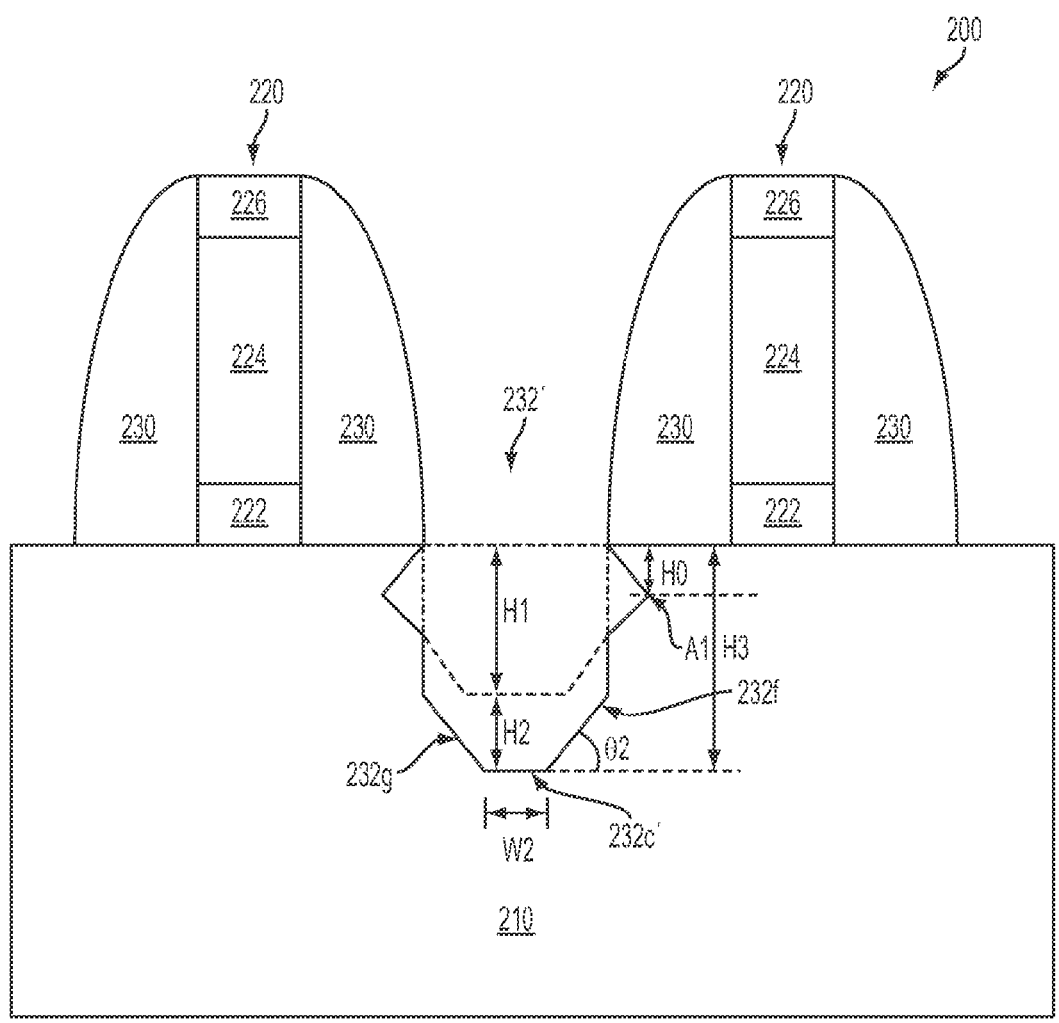

In FIG. 5A, the semiconductor device 200 illustrated in FIG. 5 is enlarged for better understanding of the profile of the enlarged recess cavities 232'. In some embodiments, the facet 232f/232g forms an angle θ2 to the principal surface of the substrate 210. In some embodiments, the angle θ2 is the same as to the angle θ1. The angle θ2, for example, is ranging from about 40 degrees to about 70 degrees with respect to the principle surface of substrate 210. In the depicted embodiment, the facet 232c' has a width W2 ranging from about 20 Angstroms to about 200 Angstroms. In some embodiments, a height H2 between the original bottom surface (facet 232c) to the newly formed bottom surface (facet 232c') ranges from about 50 Angstroms to about 200 Angstroms. The enlarged recess cavity 232', defined by facets 232a, 232b, 232b', 232f, 232c', 232g, 232d, 232d', and 232e, has an increased height H3 (H1+H2) but without changing the tip height H0 or the tip width W0. In some embodiments, a ratio of the increased height H3 over the width W2 in the enlarged recess cavity 232' is greater than the ratio of the height H1 to the width W1 in the original recess cavity 232'. In some embodiments, a ratio of the increased height H3 over the width W2 ranges from about 1.5 to about 30.

In the depicted embodiment, the enlarging process is a dry anisotropic etching process utilizing an etching pressure of about 1 mTorr to about 30 mTorr, a source power of about 200 W to about 2000 W, an RF bias voltage of about 30 V to about 200 V, and an etchant that includes CF$_4$, Cl$_2$, HBr or combinations thereof. In an example, the etching process includes an etching pressure of about 1 mTorr to about 20 mTorr, a source power of about 200 W to about 2000 W, an RF bias voltage of about 50 V to about 200 V, a CF$_4$ gas flow of about 5 sccm to about 50 sccm. In yet another example, the etching process includes an etching pressure of about 1 mTorr to about 30 mTorr, a source power of about 100 W to about 1000 W, an RF bias voltage of about 30 V to about 180 V, a CF$_4$ gas flow of about 10 sccm to about 100 sccm, a Cl$_2$ gas flow of about 5 sccm to about 40 sccm, an HBr gas flow of about 10 sccm to about 60 sccm.

Figure 6A:
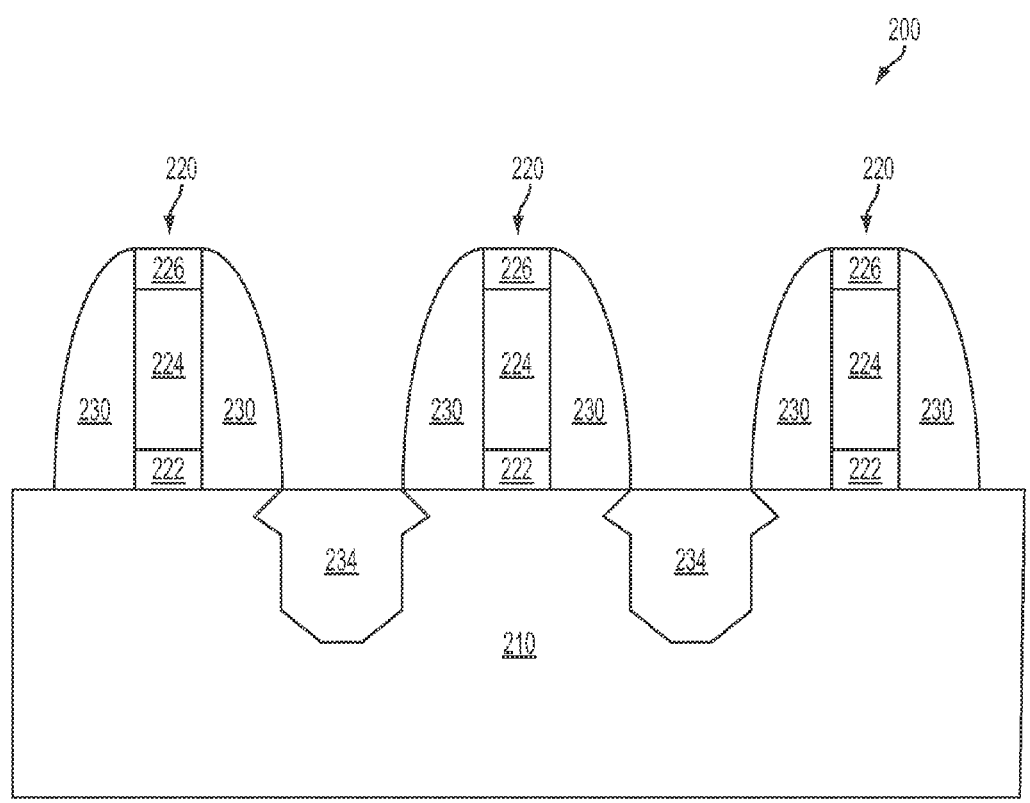
Figure 6B:
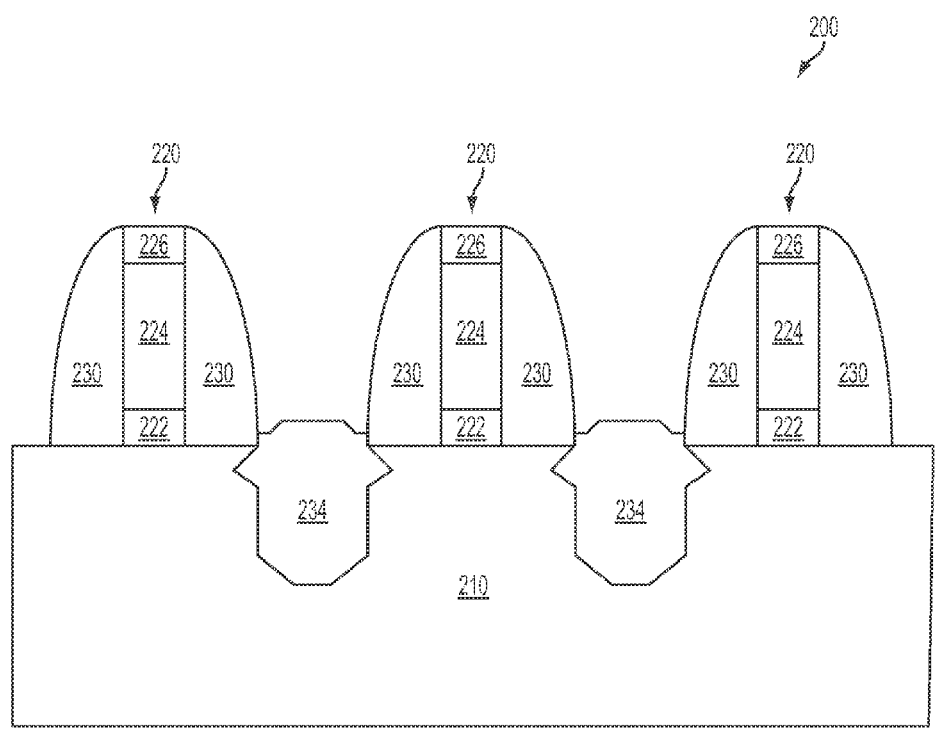

Referring to FIGS. 1, 6A, and 6B, the method 100 continues with step 110 in which a strained material 234 is formed in the enlarged recesses 232'. In the depicted embodiment, the strained material 234 fills the enlarged recesses 232' by an epitaxy or epitaxial (epi) process, including selective epitaxy growth (SEG) process, cyclic deposition and etching (CDE) process, chemical vapor deposition (CVD) techniques (e.g., vapor-phase epitaxy (VPE) and/or ultra-high vacuum CVD (UHV-CVD)), molecular beam epitaxy (MBE), other suitable epi processes, or combination thereof. The epi process may use gaseous and/or liquid precursors, which may interact with the composition of the substrate 210.

In some embodiments, the strained material 234 functions as a strain layer to strain or stress the channel region underneath the gate structure 220 and enhance carrier mobility of the device 200 to improve device performance. Some factors, including the volume of strained structure, tip height, and tip width (surface proximity) etc, may affect the strain effect. By adopting the enlarged recess cavity 232' with the increased height H3, amount of the strained material 234 formed therein may therefore increased to fabricate a large-volume strained structure to enhance carrier mobility and upgrade the device performance of the semiconductor device 200. The strained material 234 in the enlarged recess cavity 232' has the same tip height H0. That is, the strain effect can be improved (increased) by increasing the volume of strained structure without sacrificing (increasing) the tip height by adopting the enlarging process.

In at least one embodiment, the strained material 234 has a top surface substantially co-planer with the top surface of the substrate 210 as shown in FIG. 6A. In another embodiment, the strained material 234 has a top surface higher than the top surface of the substrate 210 for about 50 Angstroms to about 200 Angstroms as shown in FIG. 6B. In some embodiments, the strained material 234 is a silicon-containing layer. The silicon-containing layer may further comprise one additional element. The additional element, for example, is germanium (Ge) or carbon (C). In some embodiments, the strained material 234 is SiGe for PFET devices. In some embodiments, the strained material 234 is SiC for NFET devices.

The strained material 234 may also function as source and drain features. In some embodiments, the strained material 234 comprises a dopant with a dopant concentration. In at least one embodiment, the dopant is an n-type dopant formed using a chemical such as phosphorous and/or arsenic for NFET devices. In at least another embodiment, the dopant is a p-type dopant formed using a chemical such as boron and/or $BF_2$ for PFET devices. In some embodiments, the dopant concentration is ranging from about 5E19 atoms/$cm^3$ to about 1E21 atoms/$cm^3$. In some embodiments, the dopant concentration is constant in the strained material 234. In some alternative embodiments, the dopant concentration may be gradient in the strained material 234, increasing from the bottom portion to the top portion in strained material 234.

In some embodiments, the strained material 234 is SiGe with Boron (B) dopant for a PFET device. The SiGe layer is deposited by an epi process using a Si-containing gas, e.g., silane, DCS; a Ge-containing gas, e.g., $GeH_4$, $GeCl_4$; a carrier gas, e.g., $H_2$; a B-containing gas, e.g., $B_2H_6$; and/or a selective etching gas, e.g., HCl. In at least one embodiment, a mass flow of the Si-containing gas is ranging between about 50 sccm and about 500 sccm. In at least one embodiment, a mass flow of the B-containing gas is ranging between about 10 sccm and about 200 sccm. In some other embodiment, the epi process for forming the strained material 234 may be performed under a temperature ranging from about 500° C. to about 900° C., and under a pressure ranging from about 10 Torr to about 500 Torr.

In some embodiments, the strained material 234 is Si with phosphorous (P) dopant for a NFET device. The Si layer is deposited by an epi process using a Si-containing gas, e.g., silane and/or dichlorosilane (DCS); a carrier gas, e.g., $H_2$; a P-containing gas, e.g., $PH_3$; and/or a selective etching gas, e.g., HCl. In at least one embodiment, a mass flow of the Si-containing gas is ranging between about 50 sccm and about 300 sccm. In at least one embodiment, a mass flow of the P-containing gas is ranging between about 50 sccm and about 500 sccm. In some other embodiment, the epi process for forming the strained material 234 may be performed under a temperature ranging from about 500° C. to about 850° C., and under a pressure ranging from about 5 Torr to about 200 Torr.

Figure 7:
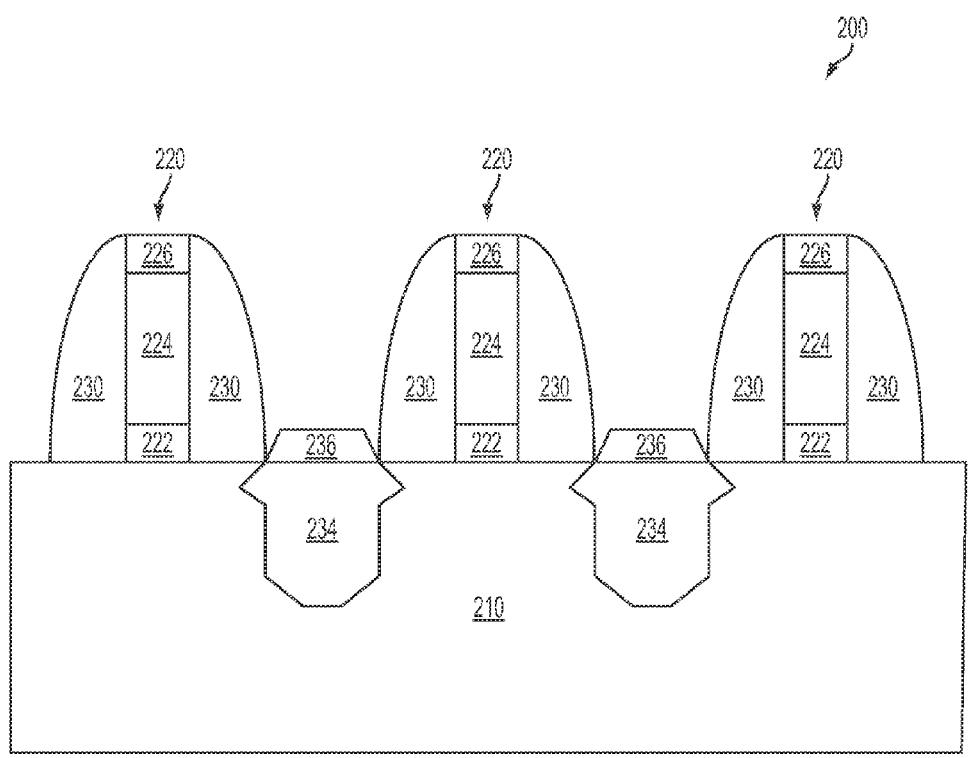

Referring to FIGS. 1 and 7, the method 100 continues with step 112 in which contact features 236 are formed over the strained material 234 and contact the top surface of strained material 234. The contact features 236 may provide a low contact resistance between the strained material 234 and a silicide layer formed subsequently. In at least one embodiment, the contact features 236 have a thickness ranging from about 80 Angstroms to about 200 Angstroms.

In some embodiments, the contact features 236 comprise silicon. In at least one embodiment, the contact features 236 comprise silicon and germanium for PFET devices. In another embodiment, the contact features 236 comprise silicon and carbon for NFET devices. In at least one embodiment, the contact features 236 comprise silicon and at least one additional element same as the additional element in the strained material 234. In some embodiments, an atomic ratio (at %) of the additional element in the contact features 236 is less than the atomic ratio (at %) of the additional element in the strained material 234. In at least one embodiment, the atomic ratio of Ge in the contact features 236 is less than about 20 at %. In some embodiments, the contact features 236 are selectively formed by an epi process using the chemicals the same as the chemicals for forming the strained material 234 as mentioned above.

Further, the epi process for forming the contact features 236 may be performed under a temperature ranging from about 500° C. to about 800° C., and under a pressure ranging from about 10 Torr to about 100 Torr. The contact features 236 may have a dopant concentration ranging from about 1E20 atoms/$cm^3$ to about 3E21 atoms/$cm^3$. The contact features 236 may further be exposed to annealing processes, such as a rapid thermal annealing process.

The semiconductor 200 is further processed to complete fabrication as discussed briefly below. For example, silicide features are formed on the contact features to reduce the contact resistance. The silicide features may be formed over the source and drain regions by a process including depositing a metal layer, annealing the metal layer such that the metal layer is able to react with silicon to form silicide, and then removing the non-reacted metal layer.

An inter-level dielectric (ILD) layer is formed on the substrate and a chemical mechanical polishing (CMP) process is further applied to the resulting structure to planarize the substrate with the ILD. Further, a contact etch stop layer (CESL) may be formed on top of the gate structure before forming the ILD layer. In at least one embodiment, the gate electrode remains to be polysilicon in the final device. In another embodiment, the polysilicon is removed and replaced with a metal in a gate last or gate replacement process. In a gate last process, the CMP process on the ILD layer is continued to expose the polysilicon gate electrode of the gate structures, and an etching process is performed to remove the polysilicon gate electrode, thereby forming trenches. The trenches are filled with a proper work function metal (e.g., p-type work function metal and n-type work function metal) for the PFET devices and the NFET devices.

A multilayer interconnection (MLI) including metal layers and inter-metal dielectric (IMD) is formed over the substrate to electrically connect various features or structures of the semiconductor device. The multilayer interconnection includes vertical interconnects, such as vias or contacts, and horizontal interconnects, such as metal lines. The various interconnection features may utilize various conductive materials including copper, tungsten, and/or silicide. In one example, a damascene process is used to form copper multilayer interconnection structure.

The disclosed method provides a processing for forming the improved strained features in the semiconductor device. By providing an enlarging process to a wedge-shaped recess cavity in the substrate, the wedge-shaped recess cavity can be transformed to an enlarged recess cavity with an increased height, therefore increasing a volume of the recess cavity and the strain material subsequently formed in the enlarged recess cavity. Hence, additional channel strain is provided to increase carrier mobility and further enhance the device performance. Further, the tip height or the surface proximity of the enlarged recess cavity can be the same after the enlarging process. Hence, it is possible to form an original wedge-shaped recess cavity with pre-determined tip height or surface proximity. Then, conducting an enlarging process to further increase the height of the recess cavity. Further, it is likely to insert a buffer layer with graded composition between the substrate and the strain material because of the increased room of the enlarged recess cavity. It has been observed that the disclosed methods and integrated circuit devices result in improved device performance, including but not limited to, improved control over short channel effects, increased saturation current, improved control of metallurgical gate length, increased carrier mobility, and decreased contact resistance between the source/drain and silicide features. It is understood that different embodiments may have different advantages, and that no particular advantage is necessarily required of any embodiment.

In some embodiments, a method of fabricating a semiconductor device comprises forming gate structures over a top surface of a substrate; forming a pair of spacers adjoining each opposite sidewalls of the gate structures; forming an initial recess with an initial bottom surface in the substrate, wherein the initial recess has a first height measured from the top surface of the substrate to the initial bottom surface; transforming the initial recess into an enlarged recess with a final bottom surface in the substrate, the enlarged recess has a second height measured from the top surface of the substrate to the final bottom surface, wherein the second height is greater then the first height; and epitaxially growing a strained material in the enlarged recess.

In some embodiments, a method of fabricating a semiconductor device comprises forming a gate structure over a semiconductor substrate, the gate structure defining a channel region in the semiconductor substrate; forming spacers adjoining opposite sidewalls of the gate structure; performing a first etching process to form recesses in the semiconductor substrate, interposed by the channel region; performing a second etching process to transform the recesses into wedge-shaped recesses with a first depth in the semiconductor substrate, wherein the wedge-shaped recesses comprises tips under the spacers; performing a third etching process to transform the wedge-shaped recesses into enlarged recesses with a second depth in the semiconductor substrate, wherein the second depth is greater than the first depth; and epitaxially growing a semiconductor layer in the enlarged recesses.

In some embodiments, a semiconductor device comprises a substrate; a gate structure over a surface of the substrate and defining a channel region in the substrate; spacers adjoining opposite sidewalls of the gate structure; and an epitaxial feature with a bottom surface in the substrate, the epitaxial feature having a height measured from the top surface to the bottom surface, the bottom surface having a width, wherein a ratio of the height over the width is about or greater than 1.5.

The foregoing outlines features of several embodiments so that those skilled in the art may better understand the aspects of the present disclosure. Those skilled in the art would appreciate that they may readily use the present disclosure as a basis for designing or modifying other processes and structures for carrying out the same purposes and/or achieving the same advantages of the embodiments introduced herein. Those skilled in the art would also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    forming gate structures over a top surface of a substrate;
    forming a pair of spacers adjoining each opposite sidewalls of the gate structures;
    forming an initial wedge-shaped recess with an initial bottom surface in the substrate, wherein the initial wedge-shaped recess has a first height measured from the top surface of the substrate to the initial bottom surface, the initial recess has a tip with a tip height measured from the top surface of the substrate to the tip ranging from about 20 Angstroms to about 150 Angstroms, and forming the initial wedge-shaped recess includes etching a uniformly doped portion of the substrate;
    transforming the initial wedge-shaped recess into an enlarged recess with a final bottom surface in the substrate, the enlarged recess has a second height measured from the top surface of the substrate to the final bottom surface, wherein the second height is greater than the first height, and wherein a lateral width of the initial wedge-shaped recess remains unchanged, wherein the final bottom surface of the enlarged recess has a horizontal width ranging from 20 Angstroms (Å) to 200 Å;
    growing a strained material in the enlarged recess, the strained material being formed having an upper portion in a region over the top surface of the substrate; and
    forming a contact feature over the upper portion of the strained material,
    wherein the contact feature is formed having a substantially plateau-shaped profile, and the contact feature has a bottom contact surface that is substantially flat or substantially coplanar with the top surface of the substrate.

2. The method of claim 1, wherein the initial bottom surface of the initial wedge-shaped recess has a first width, and a ratio of the first height to the first width ranges from about 1 to about 10.

3. The method of claim 1, wherein the final bottom surface of the enlarged recess has a second width, and a ratio of the second height to the second width ranges from about 1.5 to about 30.

4. The method of claim 1, wherein the step of transforming is an etching process using the spacers as hard masks.

5. The method of claim 1, wherein the step of transforming is a dry anisotropic etching process.

6. The method of claim 5, wherein the dry anisotropic etching process performed using a chemical comprises $CF_4$, $Cl_2$, HBr, or combinations thereof.

7. The method of claim 1, wherein a difference between the first height and the second height ranges from about 50 Angstroms to about 200 Angstroms.

8. The method of claim 1, wherein the tip height is not substantially changed by the step of transforming.

9. A method of fabricating a semiconductor device, comprising:
   forming a gate structure over a semiconductor substrate, the gate structure defining a channel region in the semiconductor substrate;
   forming spacers adjoining opposite sidewalls of the gate structure;
   performing a first etching process to form recesses in the semiconductor substrate, wherein the channel region is between the recesses;
   performing a second etching process to transform the recesses into wedge-shaped recesses with a first depth in the semiconductor substrate, wherein the wedge-shaped recesses comprises tips under the spacers, wherein a space between adjacent wedge-shaped recesses is free of LDD regions;
   performing a third etching process to transform the wedge-shaped recesses into enlarged recesses with a second depth in the semiconductor substrate, a portion of sidewalls of the enlarged recesses is aligned with a portion of sidewalls of the spacers, wherein the second depth is greater than the first depth, wherein a bottom most portion of each enlarged recess of the enlarged recesses has a horizontal distance ranging from 20 Angstroms (Å) to 200 Å;
   epitaxially growing a semiconductor layer in the enlarged recesses, the semiconductor layer being formed in at least one of the enlarged recesses having an upper portion in a region over a top surface of the substrate; and
   forming a contact feature over the upper portion of the semiconductor layer formed in the at least one recess, wherein the contact feature is formed having a substantially plateau-shaped profile, and the contact feature has a bottom contact surface that is substantially coplanar with the top surface of the substrate.

10. The method of claim 9, wherein the first etching process is a dry etching process and the second etching process is a wet etching.

11. The method of claim 9, wherein the third etching process is a dry etching process performed using the spacers as hard masks.

12. The method of claim 9, wherein the third etching process is an anisotropic dry etching process.

13. The method of claim 12, wherein the anisotropic dry etching process is performed using an RF bias voltage of about 0 V to about 100 V.

14. The method of claim 9, wherein the second depth is greater than the first depth for about 50 Angstroms to about 200 Angstroms.

15. The method of claim 9, wherein a tip height of the wedge-shaped recesses is not substantially changed by the third etching process.

16. A semiconductor device comprising:
   a substrate, wherein the substrate has a substantially uniform dopant profile;
   a gate structure over a top surface of the substrate and defining a channel region in the substrate;
   spacers adjoining opposite sidewalls of the gate structure;
   an epitaxial feature with a bottom surface in the substrate, the epitaxial feature having a height measured from the top surface of the substrate to the bottom surface, the bottom surface having a width; and
   a contact feature over the epitaxial feature,
   wherein
     a ratio of the height of the epitaxial feature over the width of the epitaxial feature is about or greater than 1.5,
     a portion of sidewalls of the epitaxial feature is aligned with a portion of sidewalls of the spacers,
     a horizontal distance of the bottom surface of the epitaxial feature ranges from 20 Angstroms (Å) to 200 Å,
     the epitaxial feature has an upper portion with a substantially plateau-shaped profile in a region over the top surface of the substrate,
     the contact feature is over the upper portion of the epitaxial feature, and
     the contact feature has a substantially plateau-shaped profile, and the contact feature has a bottom contact surface that is substantially coplanar with the top surface of the substrate.

17. The device of claim 16, wherein the epitaxial feature has two pairs of slope parallel to each other.

18. The device of claim 16, wherein the epitaxial feature has tips with a tip height measured from the top surface of the substrate to the tips ranging from about 20 Angstroms to about 150 Angstroms.

19. The method of claim 1, wherein the initial wedge-shaped recess is formed by a dry isotropic etching process.

20. The method of claim 1, wherein the strained material is formed having a substantially plateau-shaped profile in the upper portion in the region over the top surface of the substrate.

21. The method of claim 1, wherein growing the strained material comprises growing the strained material including a first material and a second material, and the strained material has a first ratio between an atomic percentage of the first material and an atomic percentage of the second material, wherein
   forming the contact feature comprises forming the contact feature including the first material and the second material, the contact feature has a second ratio between an atomic percentage of the first material and an atomic percentage of the second materials, and the first ratio is different from the second ratio.

* * * * *